(12) United States Patent
LaCour

(10) Patent No.: US 6,601,231 B2
(45) Date of Patent: Jul. 29, 2003

(54) SPACE CLASSIFICATION FOR RESOLUTION ENHANCEMENT TECHNIQUES

(76) Inventor: Patrick Joseph LaCour, 2112 Fleming Dr., McKinney, TX (US) 75070

(*) Notice: Subject to any disclaimer, the term of this patent is extended or adjusted under 35 U.S.C. 154(b) by 0 days.

(21) Appl. No.: 09/901,839

(22) Filed: Jul. 10, 2001

(65) Prior Publication Data

US 2003/0014731 A1 Jan. 16, 2003

(51) Int. Cl.$^7$ .............................................. G06F 17/50
(52) U.S. Cl. ............................ 716/21; 716/2; 716/5; 716/11; 716/12
(58) Field of Search .......................... 716/21, 5, 11, 716/12, 2

(56) References Cited

U.S. PATENT DOCUMENTS

| | | | |
|---|---|---|---|
| 5,663,893 A | 9/1997 | Wampler et al. | 364/491 |
| 5,682,323 A | 10/1997 | Pasch et al. | 364/491 |
| 5,705,301 A | 1/1998 | Garza et al. | 430/5 |
| 5,707,765 A | 1/1998 | Chen | 430/5 |
| 5,740,068 A * | 4/1998 | Liebmann et al. | 716/21 |
| 5,821,014 A | 10/1998 | Chen et al. | 430/5 |
| 5,885,734 A * | 3/1999 | Pierrat et al. | 716/19 |
| 6,060,368 A * | 5/2000 | Hashimoto et al. | 438/401 |
| 6,139,994 A | 10/2000 | Broeke et al. | 430/5 |
| 6,175,953 B1 | 1/2001 | Scepanovic et al. | 716/21 |
| 6,222,195 B1 * | 4/2001 | Yamada et al. | 250/492.2 |
| 6,350,992 B1 * | 2/2002 | Manabe et al. | 250/492.22 |
| 6,370,679 B1 * | 4/2002 | Chang et al. | 716/19 |
| 6,413,685 B1 * | 7/2002 | Tsai et al. | 430/5 |
| 6,425,117 B1 * | 7/2002 | Pasch et al. | 716/21 |
| 2002/0104891 A1 * | 8/2002 | Otto | 235/494 |

OTHER PUBLICATIONS

Schellenberg, Frank M., "Sub–Wavelength Lithography Using OPC," *Semiconductor Fabtech*, 9$^{th}$ Edition, Mar. 1999, pp. 205–209.

Mansfield, Scott M., et al., "Lithographic Comparison of Assist Feature Design Strategies," distributed at an oral presentation at SPIE Microlithogrpahy Conference around Feb., 2000.

Liebmann, Lars W., et al., "Optimizing Style Options for Sub–Resolution Assist Features," distributed at an oral presentation at SPIE Microlithography Conference around Feb., 2001.

* cited by examiner

*Primary Examiner*—Hoai Ho
*Assistant Examiner*—Ly Duy Pham
(74) *Attorney, Agent, or Firm*—Michael O. Scheinberg

(57) ABSTRACT

The present invention comprises a method and apparatus for classifying edges for implementing mask corrections. In one embodiment, classifications are based upon proximity ranges bounded on one side only. Before classifying an edge in a first class based on a first proximity range, it is verified that the classification will produce a correction satisfying a minimum manufacturable length. If the prescribed correction for the first class does produce a correction satisfying the minimum manufacturable length, the edge is classified in a second class corresponding to a second proximity range to produce, in combination with an adjacent edge also in the second class, a manufacturable correction. The number of mask corrections implemented in a mask design is thus increased while ensuring that all mask corrections meet guidelines for manufacturability and reducing required clean-up of nonmanufacturable corrections in the design.

11 Claims, 12 Drawing Sheets

SPACE CLASSIFICATION FOR RESOLUTION ENHANCEMENT TECHNIQUES

TECHNICAL FIELD OF THE INVENTION

The invention relates to lithography, and in particular, to optical and process correction techniques for lithography masks.

BACKGROUND OF THE INVENTION

The fabrication of integrated circuits on a semiconductor substrate typically includes multiple photolithography steps. A photolithography process begins by applying a thin layer of a photoresist material to the substrate surface. The photoresist is then exposed through a photolithography exposure tool to a radiation source that changes the solubility of the photoresist at areas exposed to the radiation. The photolithography exposure tool typically includes transparent regions that do not interact with the exposing radiation and a patterned material or materials that do interact with the exposing radiation, either to block it or to shift its phase.

Areas of the photoresist that are not exposed to the radiation do not change in solubility, so those unexposed areas (if "negative photoresist" is used), or the exposed areas (if "positive photoresist" is used) can be washed away by a developer, leaving patterned photoresist on the substrate. The pattern on the photolithography exposure tool is transferred or printed onto the photo resist. The patterned photoresist is then used as a protective layer during a subsequent fabrication step, such as etching an underlying layer or diffusing atoms into unmasked areas of the substrate.

"Masks" and "reticles" are types of lithography exposure tools, that is, tools that alter radiation to print an image on the exposed surface. The term "mask" is sometimes reserved for photolithography exposure tools that print an entire wafer in one exposure, and the term "reticle" is sometimes reserved for a photolithography exposure tool that projects a demagnified image and prints less than the entire wafer during each exposure. The term "mask" is more commonly used generically, however, to refer to any type of lithography exposure tool. The term "mask" is used herein in its broadest sense to mean any type of lithography exposure tool, regardless of the magnification, the type of exposing radiation, the fraction of the wafer that is printed in each exposure, or the method, such as reflection, refraction, or absorption, used to alter the incoming radiation.

A photolithography mask typically comprises a quartz substrate with a patterned layer of opaque chromium that corresponds to the circuit pattern to be transferred to the substrate. A mask can also include a material, such as silicon nitride, that shifts the phase of the exposing radiation. A reduced image of the mask is typically projected onto the substrate, the image being stepped across the substrate in overlapping steps to repeat the pattern.

As each successive generation of integrated circuits crowd more circuit elements onto the semiconductor substrate, it is necessary to reduce the size of the features, that is, the lines and spaces that make up the circuit elements. The minimum feature size that can be accurately produced on a substrate is limited by the ability of the fabrication process to form an undistorted optical image of the mask pattern onto the substrate, the chemical and physical interaction of the photoresist with the developer, and the uniformity of the subsequent process, e.g., etching or diffusion, that uses the patterned photoresist.

When a photolithography system attempts to print circuit elements having sizes near the wavelength of the exposing radiation, the shape of printed circuit elements becomes significantly different from the pattern on the mask. For example, line-widths of circuit elements vary depending on the proximity of other lines. The inconsistent line widths can then cause circuit components that should be identical to operate at different speeds, thereby creating problems with the overall operation of the integrated circuit. As another example, lines tend to shorten, that is, the line ends "pull back." The small amount of shortening becomes more significant as the lines themselves are made smaller. Pulling back of the line ends can cause connections to be missed or to be weakened and prone to failure.

Because of the wave nature of light, even a perfectly straight, opaque edge will not produce a shadow that is absolutely dark in the shadowed areas. A phenomenon known as diffraction causes the light to bend around an edge to produce a pattern of alternating light and dark areas. The width of the alternating areas is on the order of the wavelength of the exposing light and the diffraction pattern intensity falls off rapidly in the shadowed zone. When integrated circuits were fabricated using conductor widths greater than one micron, the effect of diffraction was small and the differences between the pattern on the mask and the pattern produced on the substrate could be ignored. In modern circuits, with conductors widths well under a micron and even under two tenths of a micron, diffraction and other optical phenomena produce effects that are significant in relation to the size of features being produced by photolithography, and such effects can no longer be ignored.

Because the size of the diffraction effects is related to the wavelength of light used, one way to reduce diffraction effects is to use light of a shorter wavelength. The wavelengths used in new photolithography systems have decreased over the years from visible light to ultraviolet to deep ultraviolet. Systems using extreme ultra-violet or soft x-rays are currently being developed. It is desirable, however, to improve the resolution of existing photolithography systems because of the high cost of new systems and because it takes many years for a new generation of photolithography systems to become stable production tools. Moreover, the rate at which shorter wavelength systems are being developed is expected to be insufficient to keep up with the expected reduction in circuit feature size. Thus, it will likely be necessary to overcome diffraction effects, regardless of the wavelength used.

Because it can be determined in many instances how the pattern projected onto the substrate will vary from the mask pattern, the mask pattern can be altered to pre-compensate for the distortion. The printed pattern, rather than the mask pattern itself, then portrays the desired circuit. Techniques for pre-compensating the mask are examples of resolution-enhancing corrections or resolution enhancement techniques. A mask is typically altered by moving features of the mask or adding "sub-resolution" assist features, that is, features that are too small to be imaged individually on the substrate, but that scatter or bend light to alter the image of other, larger features on the mask. These "predistortions" cancel the distortions inherent in the lithography process, resulting in a layout that has improved fidelity to the intended design, improved manufacturing yield, and better circuit performance.

For example, it is known that diffraction effects tend to round off square corners and shorten lines. FIG. 1A shows a pattern 100 on a portion of a mask 102, and FIG. 1B shows the pattern 104 printed by mask 102 onto a substrate 106.

Printed pattern 104 is shorter than mask pattern 100 and printed pattern 104 has rounded corners. FIG. 1C shows a modified mask pattern 108 having "serifs" 110 added. FIG. 1D shows the pattern 116 projected onto a substrate 118 by mask pattern 108 using serifs 110. Printed pattern 116 is not as shortened as pattern 104 in FIG. 1B and the corners are not as rounded. The use of serifs was described as early as 1981 by B. E. A. Saleh and S. Sayegh in "Reduction of Error of Microphotographic Reproductions by Optimal Correction of Original Masks," *Opt. Eng.*, vol. 20, p. 781, and is described more recently, for example, in U.S. Pat. No 5,707,765 to Chen for "Photolithography Mask Using Serifs and Method Thereof."

It is also known that the diffraction patterns of closely spaced mask pattern features interact. For example, FIG. 2A shows a group of closely spaced parallel lines 202 and an isolated line 206. Isolated line 206 will print a line having a width different from that of lines printed by closely spaced lines 202. Non-uniform thickness in printed lines can interfere with circuit device functioning as described above. Isolated lines can be made to print like the closely spaced lines by adding "scattering bars" 210 (FIG. 2B), that is, additional lines on the mask on opposite sides of the isolated line. Scattering bars are described, for example, in U.S. Pat. No. 5,821,014 to Chen et al. for "Optical Proximity Correction Method for Intermediate Pitch Features Using Sub-Resolution Scattering Bars on a Mask." Note that a scattering bar 210 is also used along the outside edge of the line 202A, the last line in the closely spaced group. Whether or not a scattering bar is necessary along a particular edge of a feature depends upon the distance to the closest facing feature edge.

Scattering bars, like the serifs described above, are sufficiently thin that they are below the resolution limit of the lithography system and therefore do not appear or "print" on the photoresist. These features do, however, affect the printed image of the nearby features and can make the printed image of the isolated or outside lines, such as line 202A, consistent with the images of the closely spaced lines. Single or multiple scattering bars can be used on both sides of an isolated line.

FIG. 2C shows a portion of a mask 218 having another type of assist feature, anti-scattering bars 220. Anti-scattering bars 220 are actually transparent lines created in an otherwise opaque region 222 of the mask FIG. 2D shows a portion of a mask 230 having another type of mask correction. The edges 232 and 234 of features 236 and 238 are displaced to widen the features where there is a gap in the feature 240 opposite to the edge. The technique of moving an edge to widen or make thinner a feature is known as "edge biasing."

Many types of assist features have been developed. The following is an exemplary, but not exhaustive, list of design structures that can benefit from the addition of assist features: line ends, line corners, isolated lines, isolated lines adjacent to a set of dense lines, cross or "X" structures, and transistor gates.

During the design of masks for fabricating integrated circuits, resolution enhancement techniques are often implemented automatically by automated design tool. The automated design tools review the mask design to locate mask elements that would benefit from a resolution enhancement technique and automatically apply the appropriate technique to the mask. There are two basic strategies used to determine the need to apply a resolution enhancement technique. The first strategy is rule based, and compares the mask features with a set of rules. The second strategy is model-based.

In a rule-based system, the design is checked against a list of rules, and a resolution enhancement technique is applied when a rule indicates that one is required. Rule-based systems are simpler and use considerably less computing resources than do model-based systems. Because of the large number of possible combination of mask feature patterns and the relatively small number of rules, the rules do not correct the mask equally well in all situations, and correction techniques may be added where they are not necessary, thereby unnecessarily increasing the mask complexity.

In a model-based strategy, the image that would be produced by a mask pattern is determined using a software model of the mask, and resolution enhancement techniques are applied only where the model shows them to be needed. Model based strategies are more effective, but require more computational resources.

Although a mask design is ultimately a collection of polygons, the polygons represent circuit features, such as capacitors, transistors, and conductors. On a typical integrated circuit, groups of circuit features are repeated multiple times throughout the design. Circuit designers simplify the design process by treating groups of features as standard cells and reusing them throughout the design. A mask design can, therefore, be analyzed at many different levels of the design hierarchy, for example, from a collection of complex cells, to a collection of individual circuit elements, to a collection of individual polygons. Resolution enhancement techniques can be applied at any level of the design hierarchy. It is typically more efficient to apply the techniques at higher hierarchical levels, so that the techniques need be applied only once for each type of cell. When resolution enhancement techniques are applied to standard cells, however, it may still be necessary to consider how features at the edges of the cells interact with nearby features outside the cell. When a mask is being fabricated, the design is ultimately flattened to a collection of polygons.

One method used by automated software to determine mask corrections entails classifying each edge in the design according to that edge's proximity to other edges. The distance between an edge and its opposing edge will be referred to as the "proximity value" of the edge. Classification based on the proximity values of edges is referred to as "space classification." In some implementations, it is the space between the edges that is classified and the edges that define the space are then classified along with the space.

A space classification system is typically described by a table in which classes are defined by ranges of proximity value, and each class prescribes a mask correction treatment. The mask correction treatment may include, for example, adding one or more assist features, such as scattering bars or edge movements. The mask correction may also include some combination of adding assist features and edge biasing. The space classification definition table describes the position and width of the scattering bars and the extent and direction of the edge biasing.

The term "edge" typically means a collection of points, typically on the side of a polygon, and is not limited to mean the entire side of a polygon. One side of a polygon can be divided into multiple edges for convenience of analysis. Thus, a single polygon side can be considered to be a set of edges of different length, and the composition of the set can change during analysis as edges in the set are combined or divided to make a different set of edges. The point at which one edge is considered to stop and a new edge begins is generally chosen to be the point where the proximity value would put the point into a new classification because the distance between the polygon side and the nearest opposing feature may vary along the length of the polygon side. The side of a polygon can therefore be divided into multiple edges that are classified differently.

Edges that are oriented along one of the axes of the mask are referred to as orthogonal shapes. Edges that are oriented at non-normal angles to the axes are referred to as angled edges. In FIG. 3, which will be discussed below in more detail, edge 302, 304, 306, 308, and 310 are orthogonal edges. Edge 316 and 320 are angled edges. Spaces between angled edges and orthogonal edges, such as the spaces designated by letters "B", "C", and "D" of FIG. 3, are handled differently by different design tools.

Some design tools measure the proximity between an orthogonal edge and an angled edge along a line normal to the orthogonal edge. Thus, classifications for a pair of opposing edges, one angled and one orthogonal, are determined based on the orthogonal edge and then applied to both edges. For example, an edge portion of the orthogonal edge 304, such as edge 304B, and its projection 316B on angled edge 316 are thus "pairs" and are classified in the same space classification. Edges 316B and 304B therefore receive the same mask correction treatment. In FIG. 3 the treatment shown is a single scattering bar of medium thickness positioned at a prescribed distance from each of the edges.

A coarse classification system is one having few classes and each class is, therefore defined by a relatively broad range of proximity values. The resulting mask corrections, which are typically optimized for edges that have proximity values in the centers of the class ranges, are less than optimum for edges having proximity values at the ends of the class ranges. To produce optimum resolution enhancement, it is desirable to use a classification system that classifies edges into many classes, each defined by a narrow proximity range. Each mask correction is then more closely tailored to the needs of the edge to which it is applied. Such a classification is said to have fine granularity. A fine classification system may include 60 or more classes that cover a proximity range of about two microns or less.

In an actual mask design, the arrangement of edges can be very complex. As shown in space "D" of FIG. 3, there can be sudden jumps in the distance between opposing edges and edges can be oriented at non-normal angles to each other. When the opposing edges are not parallel, the distance between opposing edges is different for each point on the edges so different portions of the polygon edge may be classified differently.

As the classification changes, the mask correction specified by the class typically changes. Even with a slight change in proximity, the mask correction for the new class may change substantially. The change in the mask correction is not necessarily linear or in direct proportion to the change in proximity. When using a fine classification system, the classification of a polygon edge can change rapidly, producing extremely short and discontinuous scattering bars or edge movements. The lengths of the edges in space "C", for example, are quite short.

There is a lower limit to the size of features that mask manufacturing can reliably produce. Automated mask inspection tools, which are often used as part of the mask manufacturing process to locate unintended opaque "specks" on the mask, may identify such short assist features or edge movements as defects. Extremely short mask corrections generated by a fine classification system may produce mask assist features or edge movements that do not comply with minimum lengths standards for manufacturability and inspection.

FIG. 4 shows an example of a complex mask design in which each edge portion has generated a scattering bar segments using a classification system having fine granularity. The scattering bar segments, rather than being aligned to produce a smooth scattering bar, form a ragged line. This raggedness produces jogs and short segments, many of which cannot be reliably manufactured.

Thus, while it is desirable to use a classification having fine granularity, such a classification can result in mask design that cannot be reliably manufactured. One solution is to eliminate any scattering bars or other mask corrections that are not manufacturable. While this solution produces a manufacturable mask, it eliminates many mask corrections, thereby reducing the ability of the mask design to pre-compensate for process distortions and reducing the overall fidelity of the lithography process. Another solution would entail writing software algorithms to change assist features or edge movements that are non-manufacturable, for example, by combining corrections. Because of the large number of possible combinations of mask corrections, it would require an impractically large number of rules to anticipate and correct all possible combinations of unmanufacturable mask corrections. Thus, a system is needed to maximize the mask correction treatments while maintaining manufacturability of the mask.

SUMMARY OF THE INVENTION

An object of the invention is to improve lithography tools to improve the fidelity of the lithography process.

The present invention comprises methods and apparatuses for implementing resolution-enhancing corrections in lithography tools. In accordance with the invention, edges in the mask design are assigned to classes that specify rules for the application of mask correction techniques. The classes are defined by ranges of proximity values. Each edge is classified based upon its proximity to its nearest opposing edge and based on an additional criterion, such as a minimum length that can be reliably manufactured and inspected.

The invention includes not only methods for designing a mask, but also software for implementing the methods, a computer programmed to carry out the methods, a computer implementable description of a mask design determined by application of the methods, the fabrication of a mask designed by the methods, and the mask designed by the methods.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

In accordance with a preferred embodiment of the invention, each edge of the mask design is classified, that is, assigned to a single class. Edge classes are based upon the proximity of the edge being classified to its nearest opposing edge. Each class is defined by a range of proximities. The proximity ranges defining the classes are preferably not mutually exclusive, that is, they overlap. Some edges have proximity values that fit within the proximity range of more than one class, and those edges could be properly classified in more than one class. Each edge, however, is ultimately assigned to a single class to unambiguously define a mask correction to be applied to that edge. In accordance with the invention, the class into which each edge is ultimately classified is determined not only by its proximity of its nearest edge, but also by an additional criterion, such as a manufacturability criterion.

When an edge can properly be classified into more than one class, each edge is preferably placed into the most restrictive class in which it fits and in which the resulting mask design complies with the additional criterion. By most restrictive class is meant the class with the smallest range. For example, if the proximity range of one class includes proximity values of less than 0.2 $\mu$m and the proximity range of a second class includes proximity values of less than 0.3 $\mu$m, an edge having a proximity value of 0.15 $\mu$m would be preferably classified into the first class.

If classification in the most restrictive class would result in a mask correction that does not satisfy the additional criterion, the edge is classified into a different class in which the edge produces a mask correction that, combined with the mask correction from one or more additional edges, meets the additional criterion. In a preferred embodiment, the additional criterion is a minimum manufacturable length and the edge length is compared to the minimum length to determine whether the correction applied to that edge is manufacturable.

The invention provides more mask corrections in the design than does the prior art, without requiring a large number of rules to clean up non-manufacturable corrections after they have been generated. The prior art systems classified edges based only on proximity and then tried to clean up or eliminate unmanufacturable mask corrections generated as a result of the classification. The invention considers the manufacturability of the mask correction earlier, during the classification process, and classifies edges in a manner that reduces unmanufacturable corrections that cannot be reliably manufactured. Thus, the invention does not produce as many unmanufacturable corrections, so much of the "after-the-fact" design cleanup is eliminated.

Figure 5:
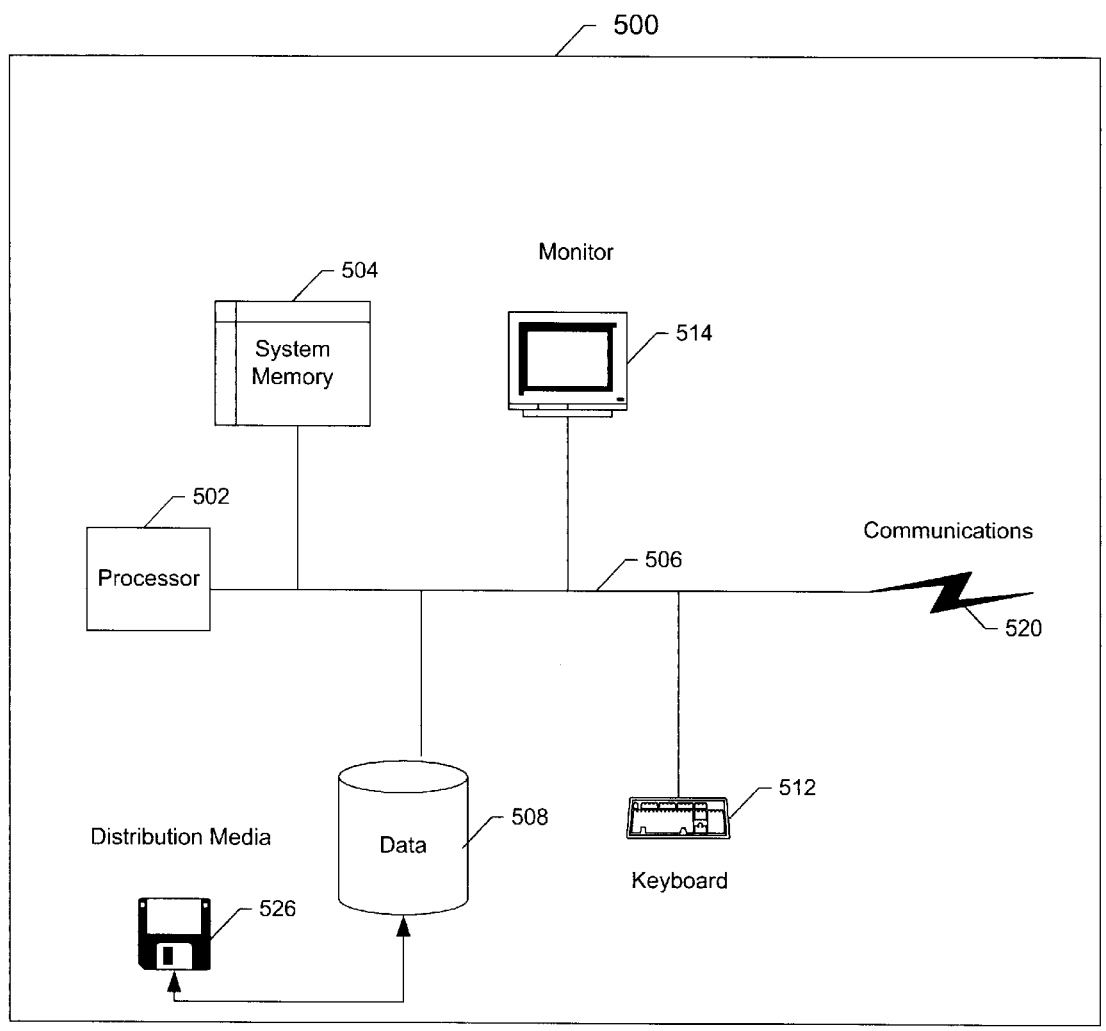
FIG. 5 shows an example of hardware that can be used to implement the present invention.

FIG. 5 illustrates a typical computer system 500 that is suitable for use in practicing the invention. Computer system 500 includes a processor 502 and a system memory 504 coupled to each other via system bus 506. Also coupled to system bus 506 are non-volatile mass storage 508, which can include hard disks, floppy disk, optical storage, and so forth; input/output devices, such as a keyboard 512, a display 514, and so forth; and communication interfaces 520, such as a modem, LAN interfaces, and so forth. Each of these elements performs its conventional functions known in the art.

System memory 504 and non-volatile mass storage 508 store a working copy and a permanent copy of the programming instructions for implementing the present invention. Non-volatile mass storage 508 and system memory 504 also store designs for integrated circuits. Non-volatile mass storage 508 may include storage that is physically separated from computer 500 and is accessed through one or more communication interfaces 520. The permanent copy of the programming instructions may be loaded into non-volatile mass storage 508 in the factory, or in the field, using distribution source/medium 526 and optionally, through communication interfaces 520.

Examples of distribution medium 526 include recordable medium such as tapes, CDROM, DVD, network connections, and so forth. In one embodiment, the programming instructions are part of a collection of programming instructions implementing an Electronic Design Automation (EDA) tool. The elements of computer system 500 are well known, and accordingly will not be further described. Thus, computer readable media upon which instructions for carrying the inventive method can be stored include any combination of distributive media 526, system memory 504, non-volatile mass storage 508, and other media that is part of computer system 500, inserted into computer system 500, or connected to computer system 500 through a network.

Figure 6:
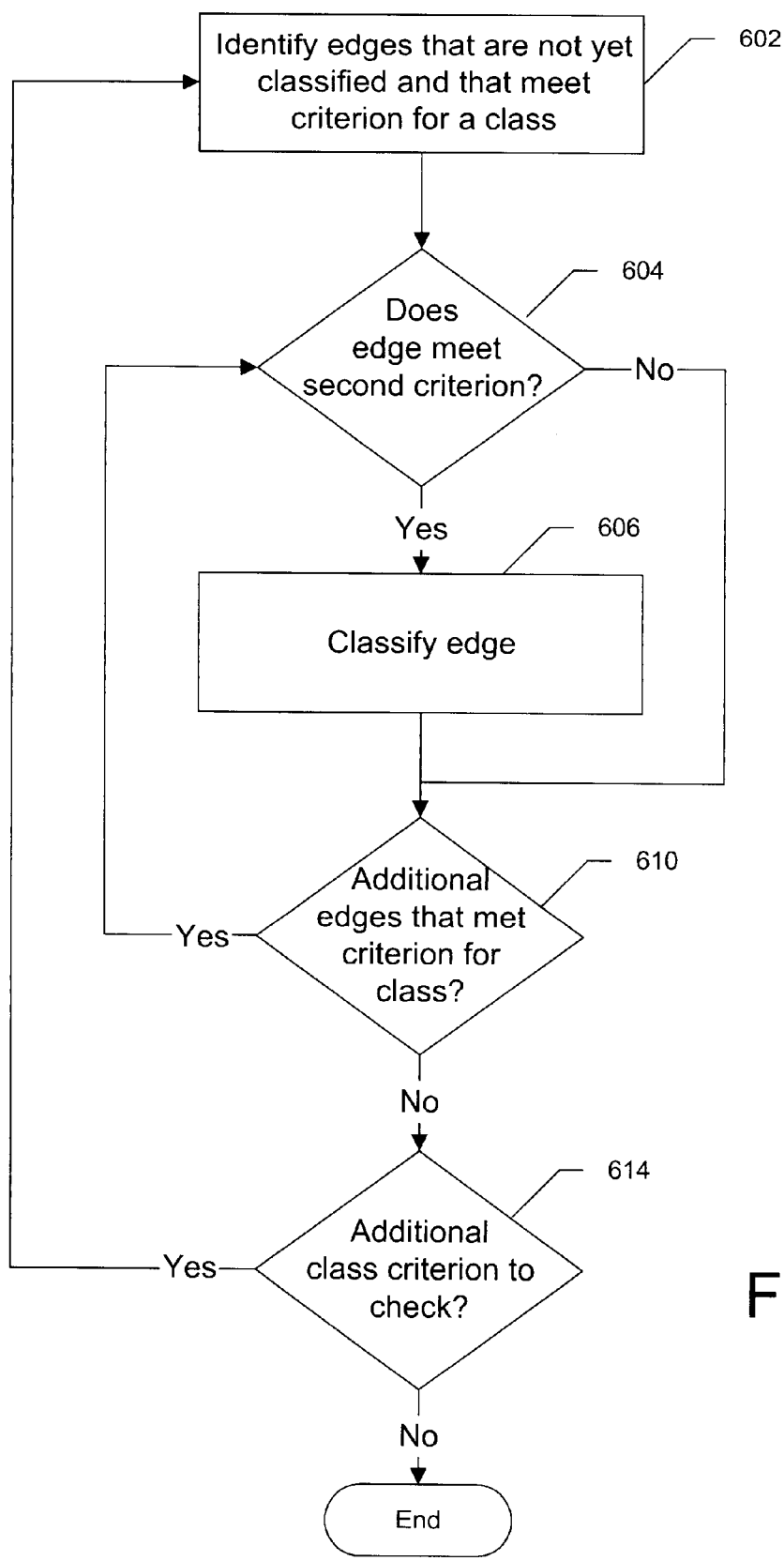
FIG. 6 is a flow chart showing the steps of a preferred embodiment of the invention.

FIG. 6 is a flow chart showing the steps of a preferred embodiment of the invention. Step 602 shows that the mask design is analyzed to identify edges or portions of edges that have not been previously classified and that meet a first criterion corresponding to a class in a classification system. The classes in the classification system are not mutually exclusive, that is, edges can fit into more than one class, although each edge is ultimately assigned to a single class. The first criterion is typically a maximum distance from the nearest opposing edge. Thus, software in step 602 will typically return all edges having a value less than a specified value. When step 602 is performed for the first class in the mask design, none of the returned edges will have been previously classified.

In step 604, a first edge that met the first criterion in step 602 is tested to determine whether it meets a second criterion, such as being greater than a minimum length for manufacturability. If the first edge meets the second criterion, the first edge is classified in step 606 into the first class. If the first edge fails to meet the second criterion, the first edge is not classified in the first class and step 606 is skipped. Skilled persons will recognize that the second criteria may vary for different classes. For example, a class that does not result in a mask correction, such as a class comprising edges having very close opposing edges, may not require a minimum length for manufacturability because edges in that class would not result in a mask correction.

If in step 610, it is found that not all of the edges meeting the first criterion have been checked to determine whether they meet the second criterion, the next edge meeting the first classification is checked. This process is repeated until all edges that meet the first classification criterion are tested in step 604 to determine whether they meet the second criterion, and all edges that meet both criteria have been classified in step 610.

This process beginning with step 602 is repeated for each of the classes in the classification system. Because the classes are not mutually exclusive, edges that failed to be classified in one class may be classified, along with an adjacent edge, in a different class. The combination of the failed edge with the adjacent edge in the second class may satisfy the additional criterion, when the failed edge alone did not. Step 614 shows that the process is repeated until all classes have been processed. At that time, all edges will have been classified and all mask corrections will meet the manufacturability criteria.

Figure 4:
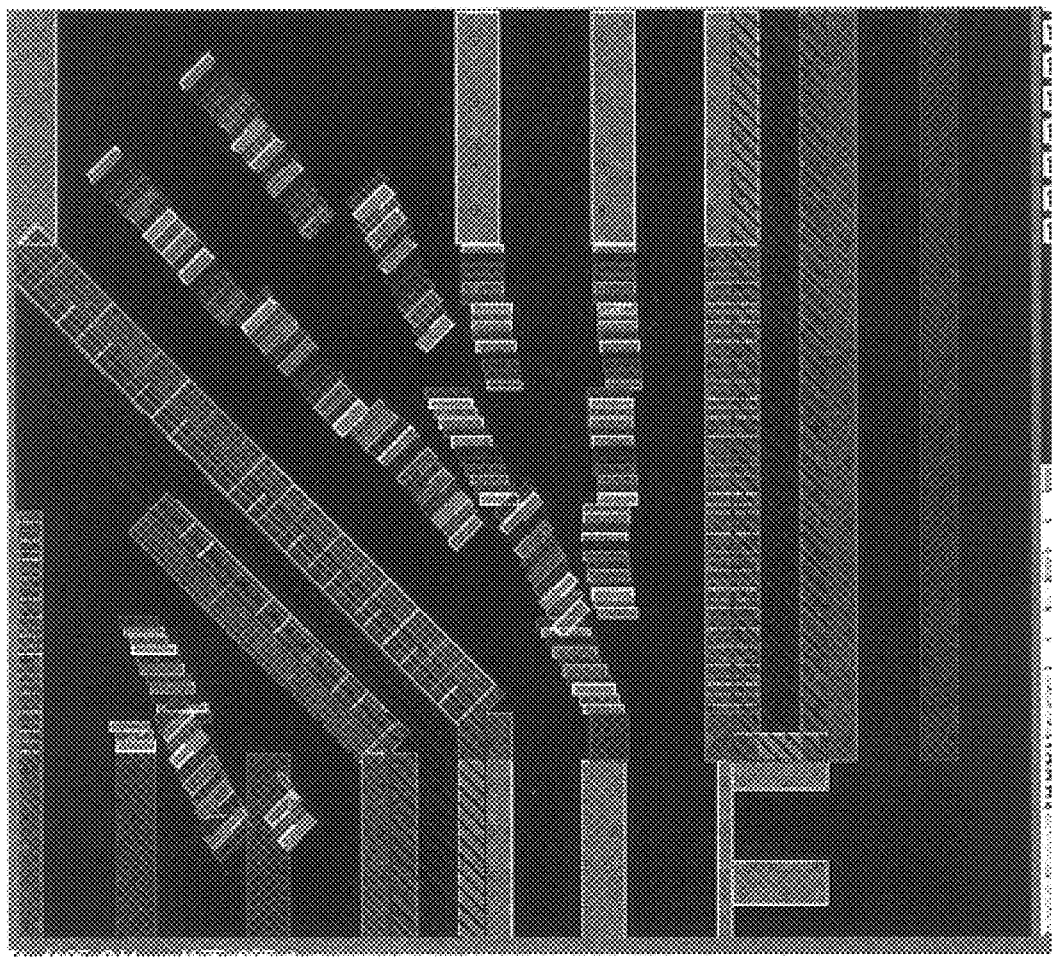
FIG. 4 shows an example of a complex mask design including mask corrections that cannot be reliably manufactured.
Figure 11:
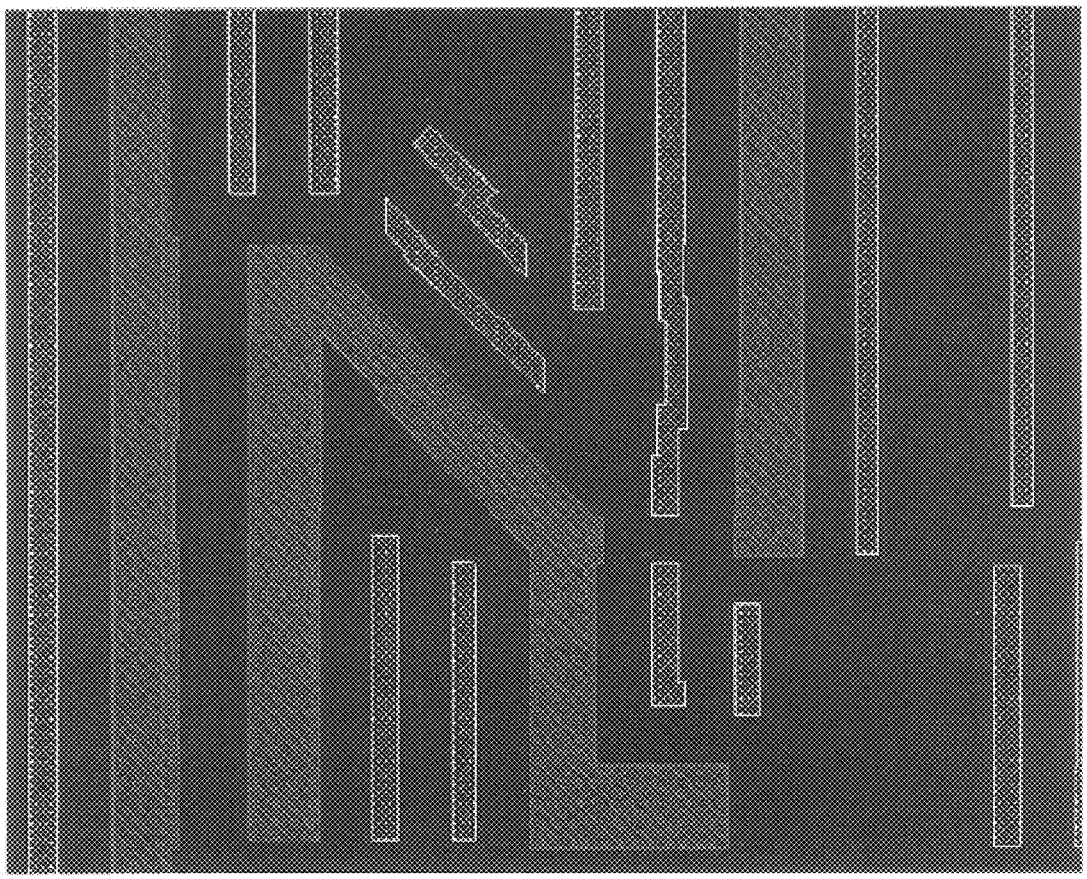
FIG. 11 shows the complex mask design of FIG. 4 processed in accordance with an embodiment of the invention to maximize mask corrections, while ensuring that the mask corrections are manufacturable.

FIG. 11 shows the results of applying the invention to the same mask design that produced the mask corrections shown in FIG. 4. In the mask design shown in FIG. 11, unmanufacturable mask corrections are eliminated while the number of mask corrections employed is greater than the number in the prior art.

Figure 7:
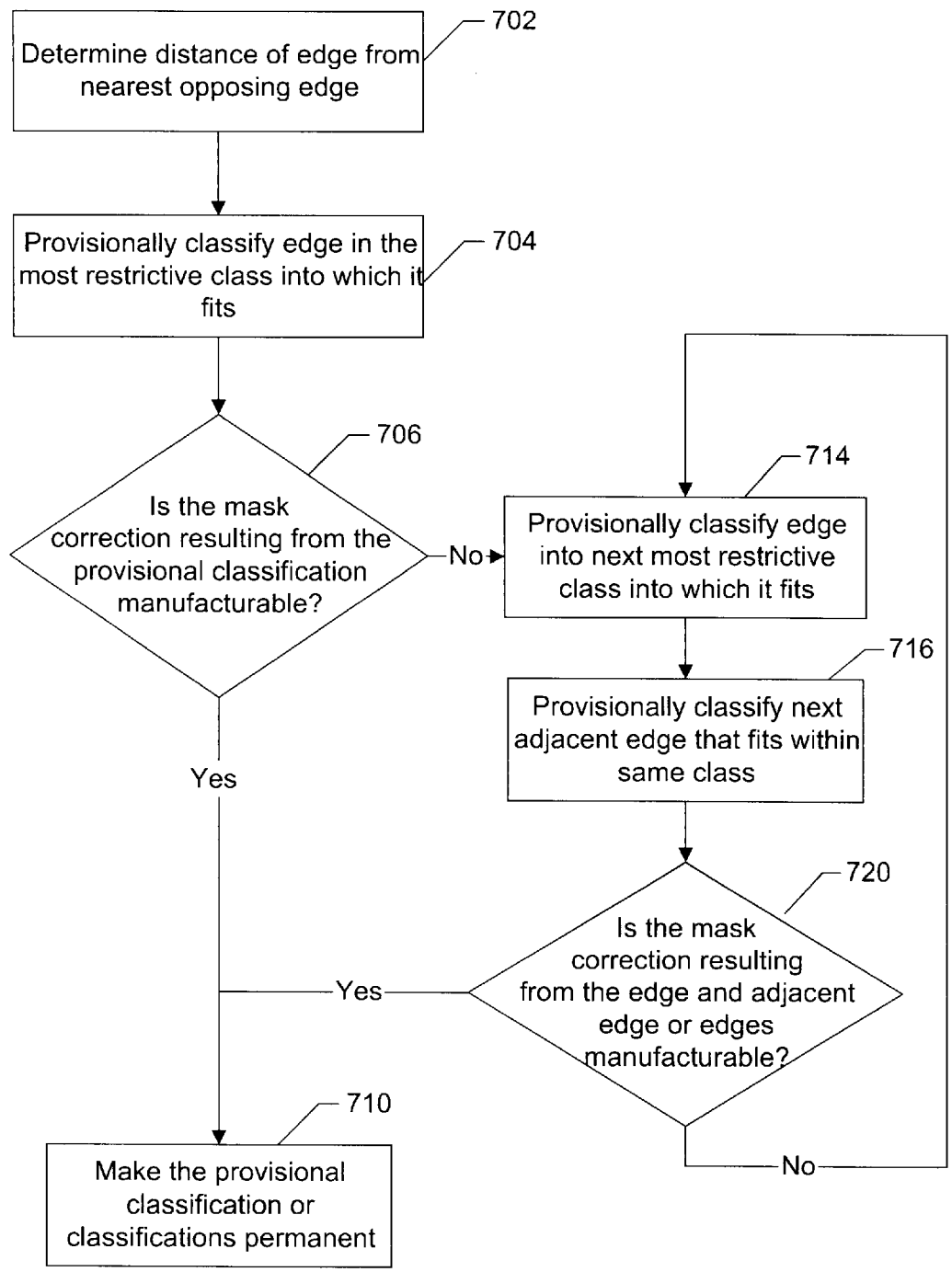
FIG. 7 is a flow chart showing the steps of one possible implementation of the invention.

FIG. 7 is a flow chart illustrating one process for implementing the invention. In the implementation of FIG. 7, edge classes are defined by proximity ranges. Each range is preferably bounded on only one side, that is, each range has an upper limit or a lower limit, but not both. For ease of explanation, it will be assumed that each classification range has an upper limit, but not a lower limit. Edges are classified based upon their proximity values. In step 702, the distance from a first edge to its nearest opposing edge is determined to define a proximity value for the first edge. In step 704, the first edge is provisionally classified into the most restrictive class into which it will fit.

After an edge is provisionally classified, it is then determined in step 706 whether the mask design resulting from that classification is manufacturable. For example, if the mask correction rule associated with the provisional class were to produce a scattering bar or edge jog that was too short to be reliably manufactured, the provisional classification would not be retained. Because the scattering bar has the same length as the edge itself, the length of the edge itself can be compared to a minimum length to determine whether the scattering bar would be manufacturable. If the mask design were found to satisfy the manufacturability criterion in step 706, the edge is permanently assigned in step 710 to the class into which it was provisionally classified. The term "permanent" is relative and does not imply that the classification may not be changed later in the design process.

Figure 1A:
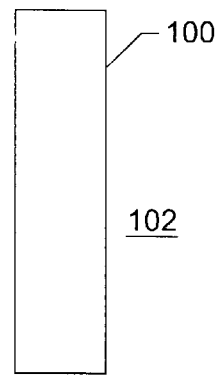
FIG. 1A shows a rectangular pattern on a mask.
Figure 1B:
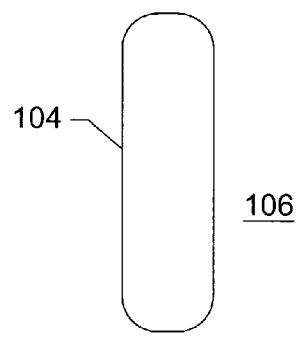
FIG. 1B shows how the mask of FIG. 1A would print on a substrate.
Figure 1C:
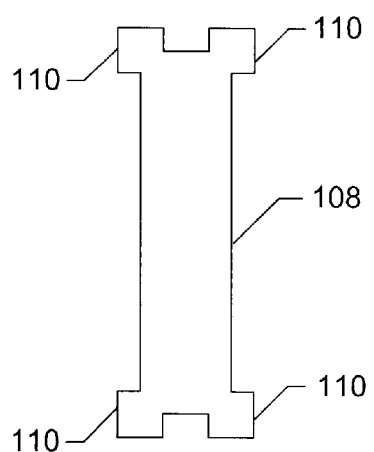
FIG. 1C shows the mask of FIG. 1A modified to add serifs.
Figure 1D:
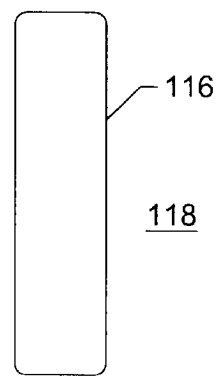
FIG. 1D shows how the mask of FIG. 1C would print on a substrate.
Figure 2A:
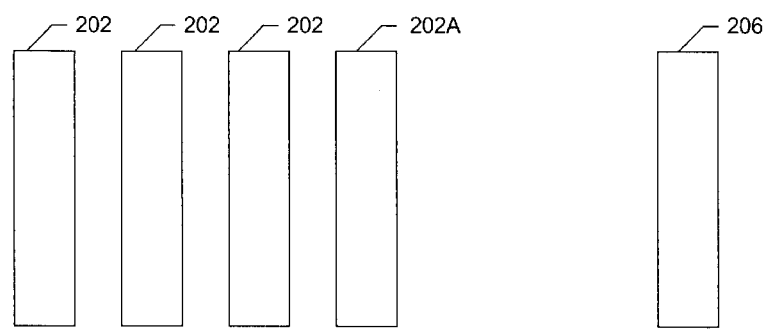
FIG. 2A shows a sample mask pattern having closely spaced lines and an isolated line.
Figure 2B:
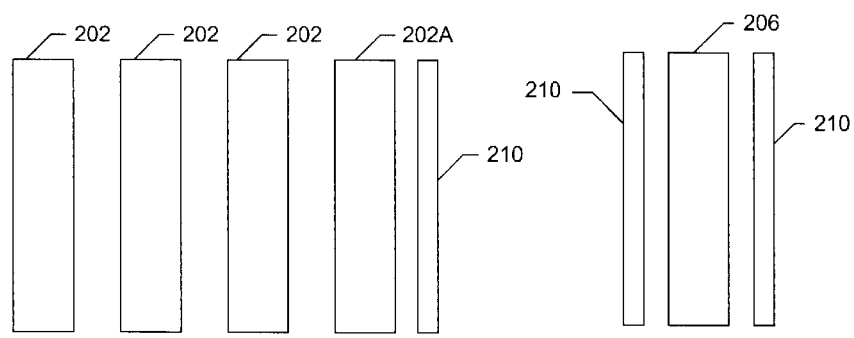
FIG. 2B shows assist features added to the mask pattern of FIG. 2A.
Figure 2C:
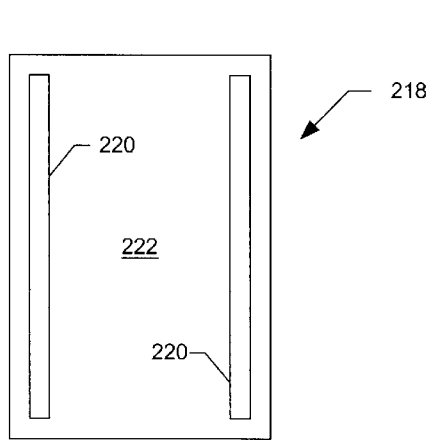
FIG. 2C shows the use of anti-scattering bars, another type of assist feature.
Figure 2D:
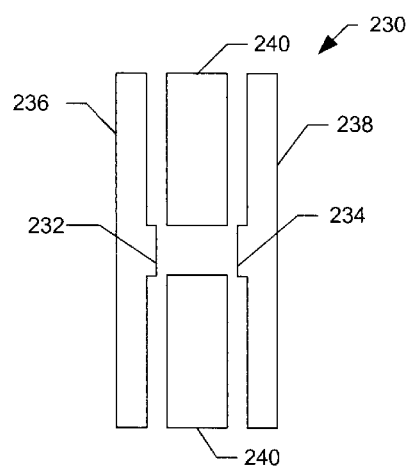
FIG. 2D shows the use of edge biasing, another type of mask correction.
Figure 3:
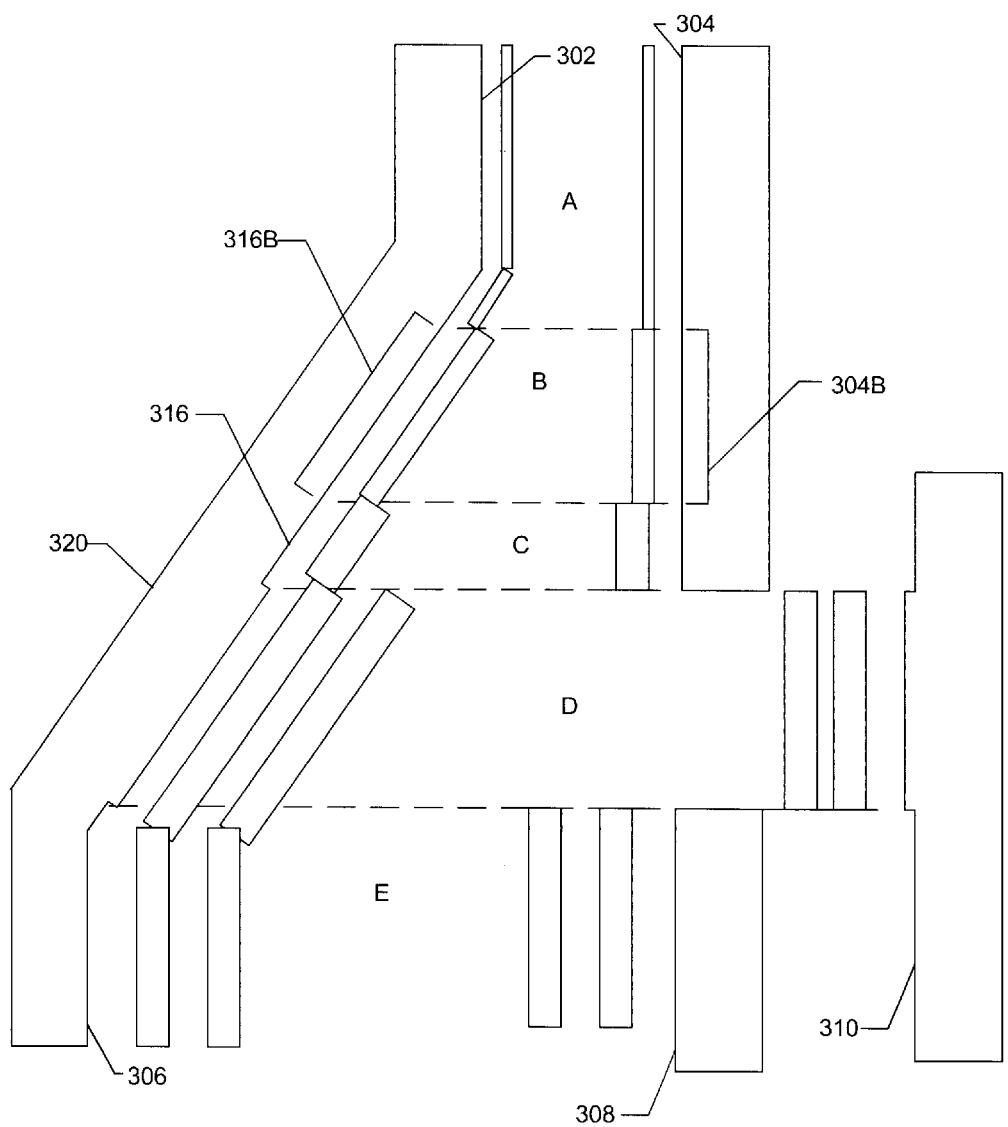
FIG. 3 shows a portion of a mask design including non-manufacturable mask corrections that cannot be reliably manufactured.

If the first edge and its opposing edge are not parallel to each other, the distance between the edges changes continuously along the polygon side. For example, in spaces B and C of FIG. 3, the proximity distance increases as one moves downward. Space B fits in one proximity range. Space C fits into a second proximity range. Because space classification ranges are defined using only upper limits, an edge classified in space B could also be classified in the classification as space C.

If a first edge remained unclassified, in step 714 it is provisionally placed in a second provisional class, the second provisional class preferably being the second most restrictive class into which it fits. Although FIG. 7 describes the process steps applied sequentially with respect to an individual edge, in most implementations, the software typically processes all edges with respect to a single classification before moving on to the next classification.

The second provisional classification for the first edge will typically be the same classification as an adjacent edge, which was also provisionally classified in the second provisional class in step 716. Thus, both the first edge and the adjacent edge are now provisionally classified in the same class, effectively providing a single, longer edge on which to apply the mask correction treatment. The mask correction resulting from the first and second edges together may meet the manufacturability criteria. In step 720, it is then determined whether the mask design resulting from the new provisional classifications is manufacturable.

If the first and second edges together produce a manufacturable mask correction, both edges are classified permanently in step 710 in the second provisional class. If the first and second edges together do not produce a manufacturable mask correction, the process is repeated until the first edge is classified in a classification that, along with other adjacent edges produces a manufacturable design. Additional edges can be combined until the first edge is classified or all classes are exhausted and the edge remains unclassified or is classified into a default class having no mask correction.

There are many ways of conceptualizing the invention and many ways of implementing it. The description above in terms of provisional classifications is useful for illustrating the invention and can be used as the basis of an algorithm for implementing the invention. The invention is not limited to that algorithm and other implementations are within the scope of the invention. For example, FIG. 7 describes processing an individual edge by testing it in various classifications until it is successfully classified. The process of FIG. 6 describes processing all unclassified edges within each proximity range successively, with edges that are not classified being processed again with the next class. Edges can be considered to be combined with other edges to achieve a successful classification or edges can be redefined for each successive classification step. Alternatively, edges can be considered to remain separate, with the results of the separate classifications producing an acceptable mask design. One can consider that the software identifies all edges having proximity values less than the limit for a class range, and then portions of the edge that have been classified are subtracted from the total edge length in determining the classification for the remaining portion of the edge. Alternatively, the software can return only unclassified portions of edge that meet the proximity criteria for the class being processed.

One can consider that the proximity ranges for different classes overlap and edges are always placed into a classification in which its proximity value is within the permitted range. Alternatively, one can consider that classes are mutually exclusive, but the edges are sometimes classified in violation of the class proximity range to produce a manufacturable mask.

To illustrate a preferred embodiment in more detail, an example will be described below using Table 1 as an exemplary classification system. The values and rules of Table 1 are simplified to illustrate the invention and may not be suitable values for use in an actual mask design criterion for Class B as well as Class A. Because edge 804A was previously classified in step 904, it is not identified in step 910.

Edges 804B and 808B are identified in step 910 as meeting the proximity criterion for Class B and not having been previously classified. In step 912, the length 804BL of edge portion 804B and the length 808BL of edge 808B are determined. In step 914, lengths 804BL and 808BL are compared to a minimum permissible feature length, $L_{min}$.

Space Classification Table

| Class | Distance from Opposing edge | Mask Correction Type | Width of Correction | Position of correction |
|---|---|---|---|---|
| A | <.1 | None | | |
| B | <.2 | Single Scattering Bar | 0.02 | Centered between edges |
| C | <.3 | Single Scattering Bar | 0.03 | Centered between edges |
| D | <.4 | Double Scattering Bar | 0.01 (each bar) | Evenly spaced between edges |
| E | <.5 | Double Scattering Bar | 0.02 (each bar) | Spaced 0.1 from edge and each other |
| F | Any distance | Double Scattering Bar | 0.03 (each bar) | Spaced 0.1 from edge and each other |
| C | Any distance | None | | |

Figure 8:
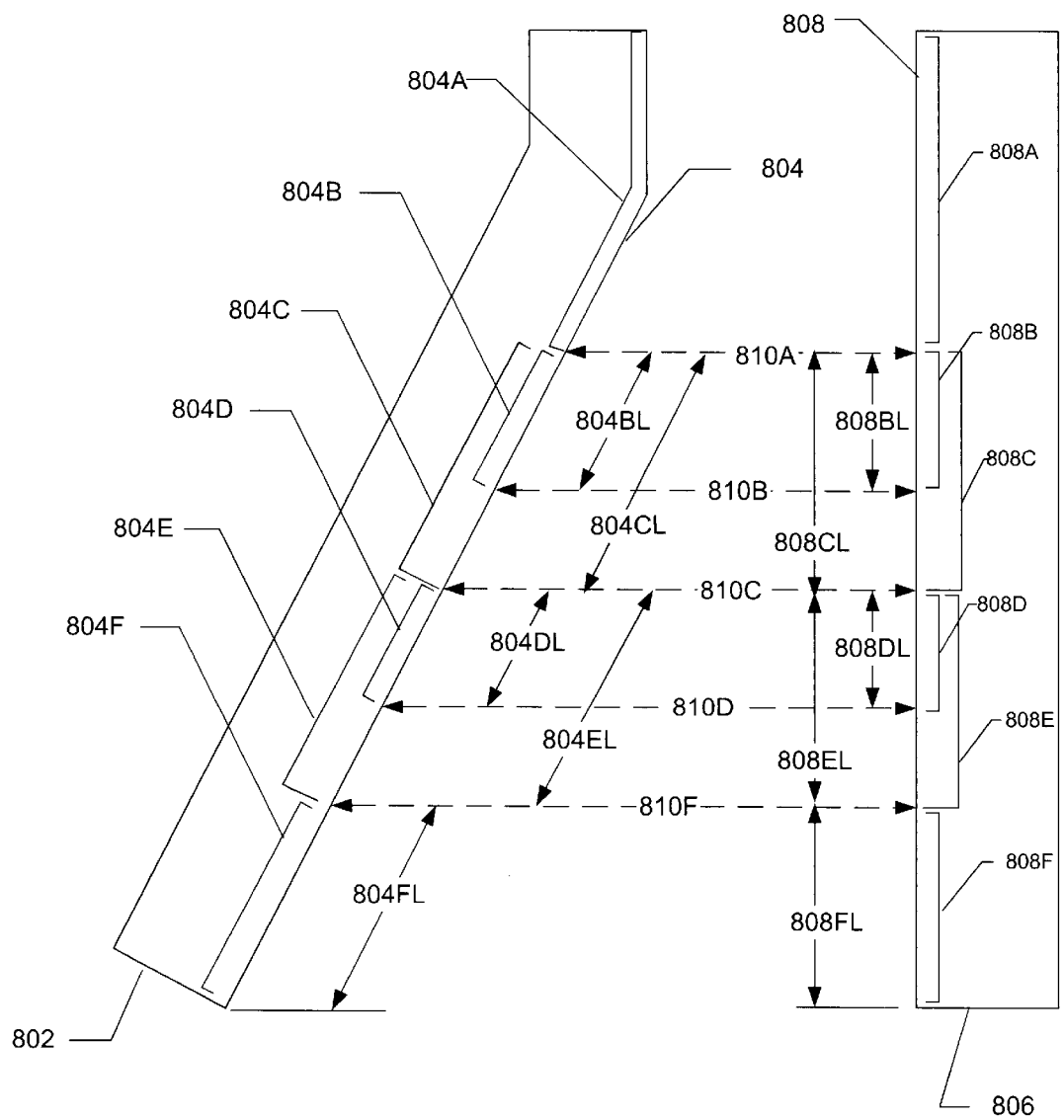
FIG. 8 is an exemplary mask design to which the present invention is applied.
Figure 9A:
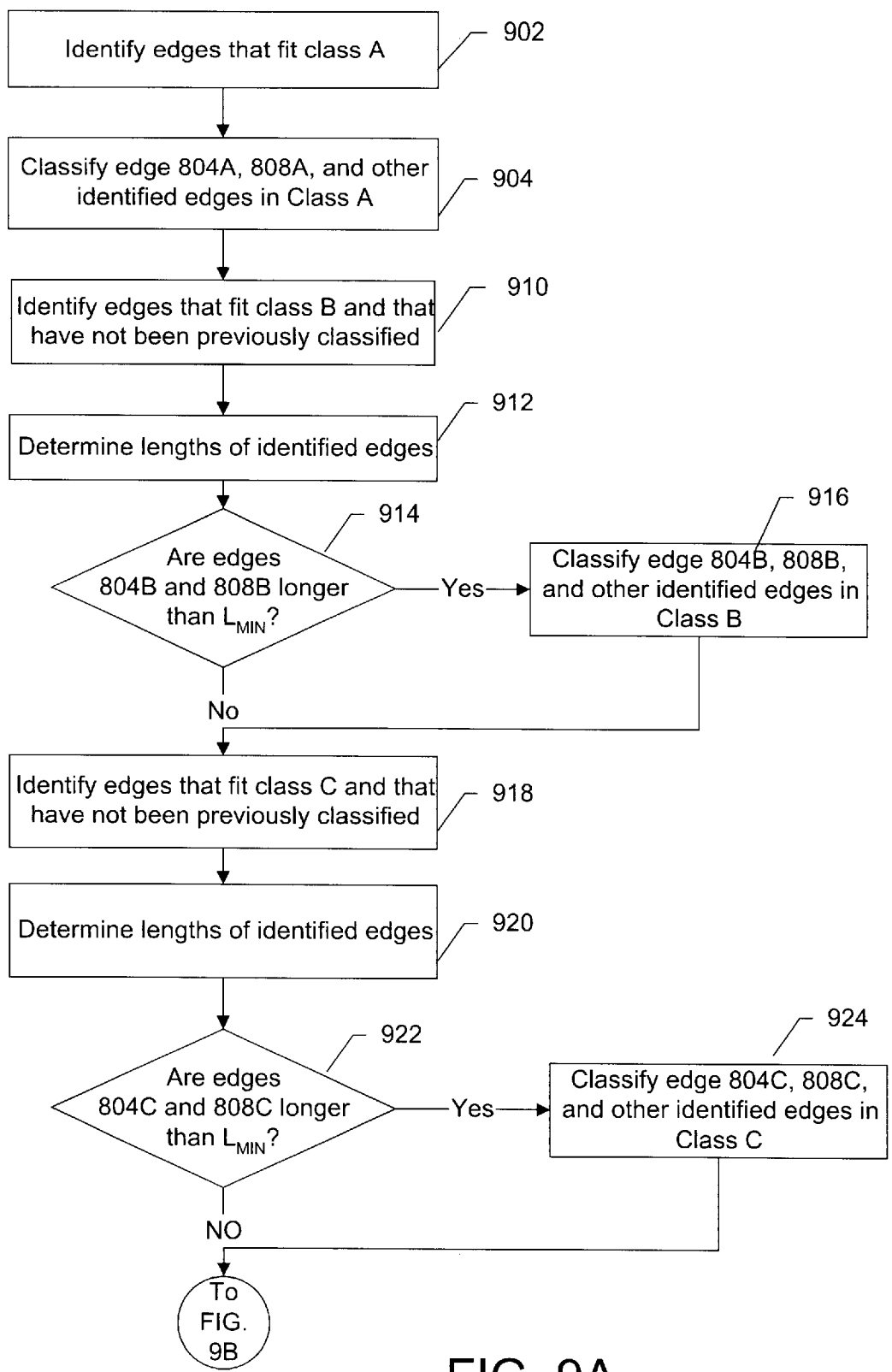
FIGS. 9A and 9B are flow charts showing the application of the invention to the exemplary mask design of FIG. 8.
Figure 9B:
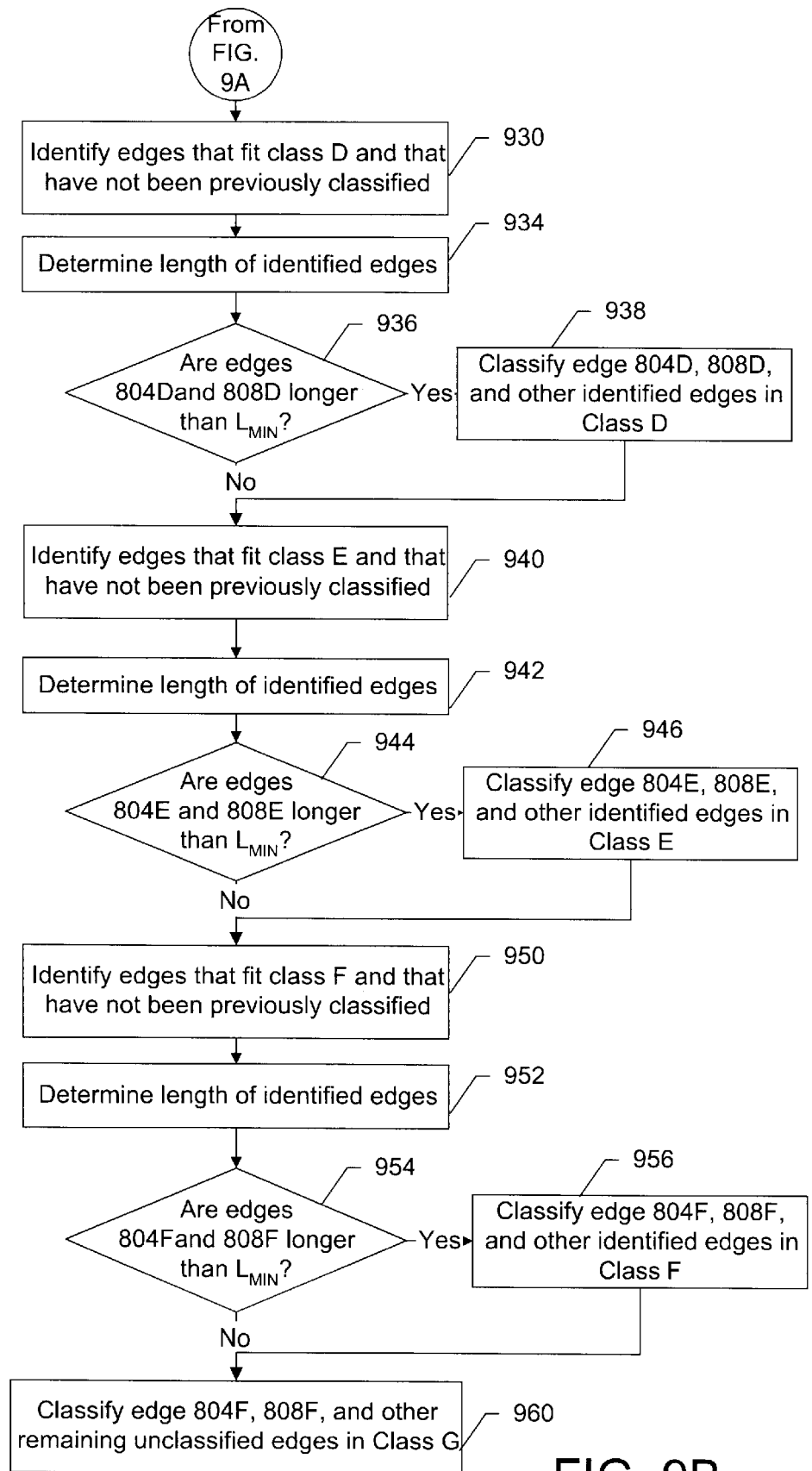

The classification of Table 1 is based on the proximity of an edge to its nearest opposing edge. For use as an example of the classification method, FIG. 8 shows a portion of a mask having edges to be classified. Brackets are used along edges 804 and 808 to illustrate where designated edges start and stop and are not part of the mask design. FIGS. 9A and 9B show the steps of a preferred method of classifying the mask edges as exemplified by the edges of FIG. 8. Skilled persons will understand that the mask design is a digital representation on a coordinate system, and that each edge is handled as if it is comprised on discrete sections of small but finite length.

FIG. 8 shows a mask polygon or feature 802 having an edge 804 and a second mask feature 806 having an edge 808 that opposes edge 804. Edge 804 is oriented at an angle to the axes of the mask and to edge 808. In the discussion below, the proximity of a portion of edge 804 and edge 808 refers to the distance from a point on angled edge 804 measured along a line perpendicular to orthogonal edge 808.

Step 902 of FIG. 9 shows that the mask design is analyzed to determine edges that meet the proximity criterion for the first class, Class A, of Table 1. FIG. 8 shows that all points of edge portion 804A (the portion of edge 804 indicated by the bracket labeled 804A) are located at a distance of less than distance 810A from their corresponding points on opposing edge 808. If distance 810A is 0.1 μm, edge 804A can be classified in Class A in accordance with Table 1. Because the rules for Class A do not prescribe any mask correction for members of Class A, it is unnecessary to determine the length of edges 804A and 808A to verify that they meet or exceed a minimum length. Step 904 shows that edge 804A, 808A, and all other edges located in step 902, are classified into Class A.

In step 910, all edges that were not previously classified and that fit within the definition of Class B are identified. The maximum proximity for Class B, 0.2 μm according to Table 1, is shown by line 810B. Note that because the Class Definition for Class B provides an upper proximity limit but not a lower proximity limit, any edge meeting the proximity criterion for Class A will also meet the proximity criterion for Class B. For example, edge 804A meets the proximity $L_{min}$ is typically determined by the capability of the manufacturing and inspection equipment. If edges 804B and 808B are longer than $L_{min}$, edges 804B and 808B are classified in step 916 into Class B. If edges 804B and 808B are not longer than $L_{min}$, edges 804B and 808B are not classified. In the example of FIG. 8, lengths 804BL and 808B are less than $L_{min}$, and so remain unclassified. Skilled persons will recognize that a designer can chose whether or not an edge will be classified if its length is exactly equal to $L_{min}$.

Because edges 804 and 808 are not parallel, opposing edge segments such as 804A and 808A will have different lengths. It is possible, therefore, that an edge segment of 804 is longer than $L_{min}$, while the opposing segment of edge 808 is shorter than $L_{min}$. If the mask designer prefers to maintain pairs of opposing edges in the same class, he can chose not to classify either opposing edge if one edge fails to satisfy the minimum length requirement. Alternatively, he can choose to classify the opposing edges in different classes, and include rules for resolving conflicting mask corrections. In FIG. 8, edge 808B is not longer than $L_{min}$, and so edge 808B remains unclassified along with edge 804B.

In step 918, edges are identified that meet the proximity criterion for Class C and that have not been previously classified. Because the definition for Class C provides an upper proximity limit but not a lower proximity limit, any edge meeting the proximity criterion for classes A or B will also meet the proximity criterion for Class C. For example, edge portion 804B meets the proximity criterion for Class C as well as Class B.

Line 810C shows the maximum proximity, 0.3 μm according to Table 1, for classification into Class C. Edges 804C and 808C are identified in step 918. Note that edge 804C includes as a subset the edge previously identified as edge 804B, and edge 808C includes as a subset the edge previously identified as edge 808B. In step 920, the length 804CL of edge 804C and the length 808CL of edge 808C are determined. In step 922, length 804CL and 808CL is compared to $L_{min}$. If 804CL and 808CL are greater than $L_{min}$, edge 804C and 808C are classified in Class C. If 804CL is not greater than $L_{min}$, edges 804C and 808C remain unclassified.

Figure 10:
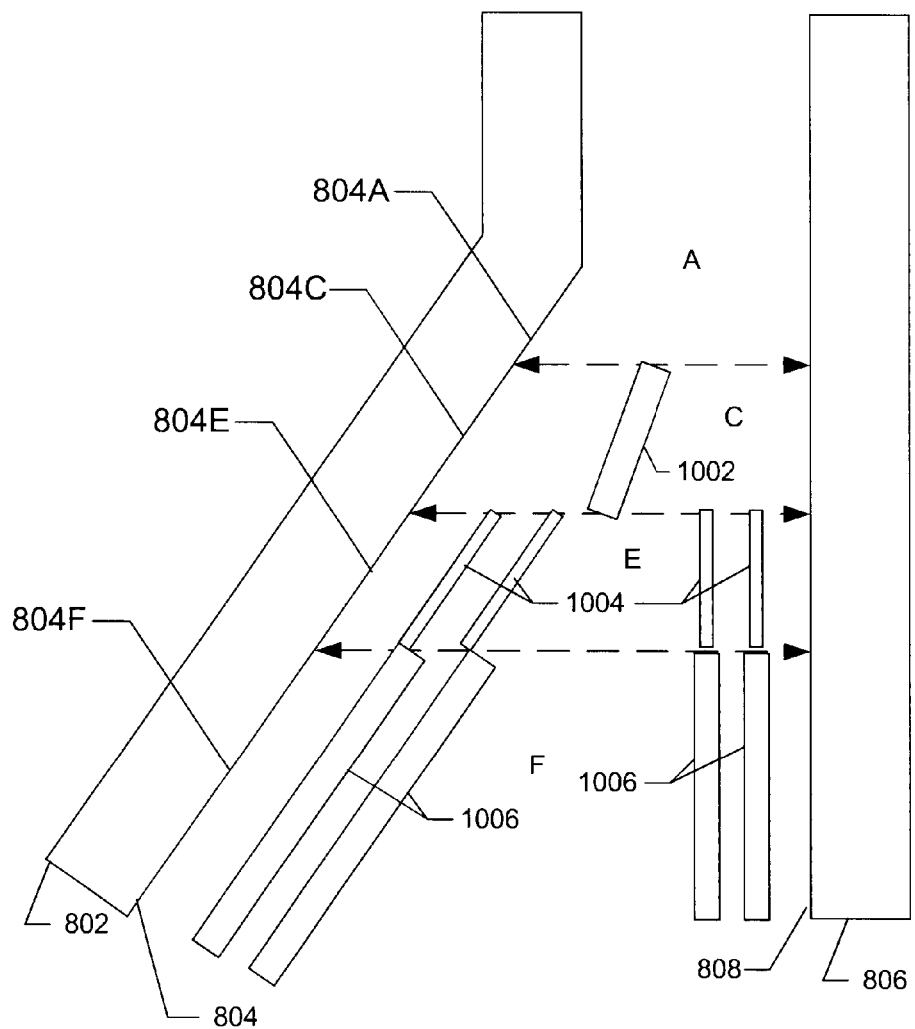
FIG. 10 shows the mask corrections incorporated into the mask design of FIG. 8 by following the process of FIG. 9.

In the example of FIG. 8, lengths 804CL and 808CL are greater than $L_{min}$, so edges 804C and 808C are classified in Class C in step 924. Note that the portion of polygon edge 804 that was designated as 804B is now classified in Class C, along with the rest of edge portion 804C. Table 1 specifies that a single scattering bar, 0.03 μm thick and centered between edge 804C and opposing edge 806 is added to the mask design. FIG. 10 shows the scattering bar 1002 applied between edges 804C and 808C.

Continuing with FIG. 9B, in step 930, all edges that were not previously classified and that fit within the definition of Class D are identified. Line 810D shows the maximum proximity, 0.4 μm according to Table 1, for classification into Class D. Because the definition for Class D provides an upper proximity limit but not a lower proximity limit, any edge meeting the proximity criterion for classes A, B, or C will also meet the proximity criterion for Class D. For example, edge portion 804C meets the proximity criterion for Class D as well as Class C. Because edge 804C was classified previously in step 924, it is not identified in step 930.

In step 930, edges 804D and 808D are identified as meeting the proximity criterion for Class D and not having been previously classified. In step 934, the length 804DL of edge portion 804D and the length of 808DL of edge 808D are determined. In step 936, length 804DL and 808DL are compared to minimum permissible feature length $L_{min}$. If edges 804D and 808D are longer than $L_{min}$, edge 804D and 808D are classified in step 938 into Class D. If edge 804D or 808D are not longer than $L_{min}$, edge 804D and 808D are not classified. In the example of FIG. 8, lengths 804DL and 808DL are less than $L_{min}$, so edges 804D and 808D remain unclassified.

In step 940, all edges that were not previously classified and that fit within the definition of Class E are identified. Line 810E shows the maximum proximity, 0.5 μm according to Table 1, for classification into Class E. Note that because the definition for Class E provides an upper proximity limit but not a lower proximity limit, any edge meeting the proximity criterion for classes A, B, C, or D will also meet the proximity criterion for Class D. For example, edge portion 804C and edge portion 804D meet the proximity criterion for Class D as well as Class C. Because edge 804C was classified previously in step 924, it is not identified in step 930.

In step 940, edges 804E and 808E are identified as meeting the proximity criterion for Class E and not having been previously classified. In step 942, the length 804EL of edge 804E and the length 808EL of edge 808E are determined. In step 944, lengths 804EL and 808EL are compared to the minimum permissible feature length $L_{min}$. If edges 804E and 808E are longer than $L_{min}$, edge 804E and 808E are classified in Class E. If edge 804E or edge 808E is not longer than $L_{min}$, edges 804E and 808E are not classified. In the example of FIG. 8, lengths 804EL and 808EL are greater than $L_{min}$, so edges 804E and 808E are classified in Class E. In accordance with Table 1, double scattering bars 1004 (FIG. 10), each having a thickness of 0.02 μm, are placed by edge 804E. Double scattering bars 1004 are also placed by edge 808E.

Class F includes all edges. In step 950, all edges that have not been previously classified are identified. Note that because the class definition for Class F encompasses all edges, Class F includes edges that also fit in classes A–E. Because edges 804A, 804C, and 804E were classified previously, they are not identified in step 950.

In step 950, edges 804F and 808F are identified as meeting the proximity criterion for Class F and not having been previously classified. In step 952, the length 804FL of edge portion 804F and the length 808FL of edge portion 808F are determined. In step 954, lengths 804FL and 808FL are compared to minimum permissible feature length, $L_{min}$. If edges 804F and 808F are longer than $L_{min}$, edges 804F and 808F are classified in step 956 into Class F. If edges 804F and 808F are not longer than $L_{min}$, edges 804F and 808F are classified in Class G.

In the example of FIG. 8, lengths 804FL and 808FL are greater than $L_{min}$, so edges 804F and 808F are in Class F. FIG. 10 shows near edges 804F and 808F scattering bars 1006 that are 0.03 μm thick and that are placed in accordance with Table 1, that is, a first scattering bar 1006 is placed 0.1 μm from edge 804E and a second scattering bar 1006 is placed 0.1 μm from the first scattering bar 1006. Any edges that remain failed to be classified in classes A–F will be classified in Class G and will not have any mask correction applied. Only very short edges will be classified in Class G, and the lack of mask correction for those short edges will have relatively minor impact on the print fidelity. Alternatively, they could receive a default correction for which the additional manufacturing constraints and cleanup code is implemented.

The example described above shows a relatively simple case of a single edge at an angle to an opposing edge. The invention also has application to other mask geometries, such as opposing orthogonal edges having gaps.

It may still be required to "clean up" the mask design after using the invention to assign space classifications. For example, the clean up may remove conflicting mask corrections generated by different edges. The clean up is greatly simplified in mask design having mask corrections generated in accordance with the invention.

Although the invention describes space classification for scattering bar generation, the invention can be used with other mask corrections techniques, such as jogging or fragmenting edges. The invention is not dependent on the method used to analyze the mask and generate the assist features. The invention can be applied at any level of the design hierarchy, from a high level to a flattened level. The mask corrections can be determined and inserted into the design at any step of the design process, although it is typical to determine assist features as part of the verification process or as part of the data preparation procedure for mask writing. If the mask corrections are added after the design is flattened, that is, reduced to a single level, the determination of the mask corrections is less complex, but many more computations are required. If the mask corrections are added when the design is still at a level of repeating cells, the mask corrections can be determined once for the interior of the cell, and those mask corrections will be the same for all cell interiors. It is still necessary to examine the interactions between edges at the cell boundary, however, to determine whether mask corrections are necessary near cell boundaries.

The rules that determine placement and form of mask corrections are specified by a designer and the rules will change depending on the lithography process used and the mask making restraints. Designers will typically determine the best set of rules for a particular process using test masks and measuring the effect of different rules on the printing process. The size and positioning of mask corrections can be determined using a rules-based approach, a model-based approach, or other technique.

The invention can be applied while resolution enhancement corrections are being determined for a mask design or can be used to improve previously determined resolution enhancement corrections, such as reclassifying previously classified edges that produce mask corrections that cannot be reliably manufactured.

The methods and apparatuses are described herein with respect to photolithography for integrated circuit manufacturing; however, the techniques described can be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques. Moreover, the invention is not limited to lithography using any particular wavelength of exposing radiation.

The steps described in the examples above can be varied in sequence without departing from the scope of the invention. For example, it is not necessary to first locate all edges in a one space classification and then all the edges in the next space classification. As another example, the ranges for space classifications can be defined by a minimum value rather than a maximum value, and the classification can proceed from the largest to the smallest class.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. In a method for determining mask corrections that includes classifying portions of edges based upon the distance from a portion of an edge to an opposing edge, with each class into which edges may be placed specifying a mask correction, the improvement comprising:

providing multiple proximity-based classes that are not mutually exclusive; and classifying edge portions into the multiple, non-mutually exclusive proximity-based classes so that the mask corrections specified by the classes for edge portions comply with mask correction criterion.

2. The method of claim 1 in which at least some of the multiple proximity-based classes are defined as distance ranges that have an upper limit or a lower limit, but not both an upper and a lower.

3. The method of claim 1 in which edges are classified into the most restrictive class into which they fit unless the mask correction associated with that class would not comply to the extra criterion.

4. The method of claim 1 in which the mask correction criteria includes a minimum size for a mask correction, the minimum size being required to reliably manufacture the mask.

5. A computer readable medium including computer instructions for carrying out the steps of claim 1.

6. A method of fabricating a lithography mask comprising forming a pattern on a substrate in accordance with a mask design determined by the steps of claim 1.

7. A lithography mask designed in accordance with the process of claim 1.

8. A computer readable medium comprising computer implementable description for fabricating a mask designed in accordance with claim 1.

9. A computer programmed to perform the steps of claim 1.

10. The method of claim 1 in which classifying edge potions into the multiple, non-mutually exclusive proximity-based classes includes classifying an edge portion into a class that specifies a mask correction that complies with one or more manufacturability criteria for manufacturing the mask correction.

11. The method of claim 10 in which classifying an edge potion into a class that specifies a mask correction that complies with one or more manufacturability criteria includes classifying an edge portion into a class that complies with a minimum length requirement.

* * * * *